United States Patent
Tsironis

(10) Patent No.: US 11,598,790 B1
(45) Date of Patent: Mar. 7, 2023

(54) HERMETIC LOAD AND SOURCE PULL WAFER PROBE STATION

(71) Applicant: Christos Tsironis, Dollard-des-Ormeaux (CA)

(72) Inventor: Christos Tsironis, Kirkland (CA)

(*) Notice: Subject to any disclaimer, the term of this patent is extended or adjusted under 35 U.S.C. 154(b) by 37 days.

(21) Appl. No.: 17/219,024

(22) Filed: Mar. 31, 2021

(51) Int. Cl.
G01R 1/18 (2006.01)
G01R 1/067 (2006.01)

(52) U.S. Cl.
CPC ............ *G01R 1/18* (2013.01); *G01R 1/06772* (2013.01)

(58) Field of Classification Search
CPC . G01R 1/18; G01R 1/06772; H01L 21/67069; H01L 21/0228; H01L 21/32136; H01L 21/6831
USPC ...... 324/754.1, 500, 754.03, 754.01, 754.13, 324/754.14, 756.03, 756.04, 757.04, 324/757.05, 754.2
See application file for complete search history.

(56) References Cited

U.S. PATENT DOCUMENTS

| | | | |
|---|---|---|---|
| 6,232,788 B1 * | 5/2001 | Schwindt | G01R 1/06705 324/750.19 |
| 9,335,345 B1 | 5/2016 | Tsironis | |
| 10,637,179 B1 | 4/2020 | Tsironis | |
| 2001/0024117 A1 * | 9/2001 | Kiyokawa | G01R 31/2603 324/76.49 |
| 2021/0285985 A1 * | 9/2021 | Zhu | G01R 1/06755 |

OTHER PUBLICATIONS

"High-frequency Performance with Low, Stable Contact Resistance on Aluminum Pads", Infinity probe [online], FormFactor [retrieved on Sep. 25, 2019], Retrieved from Internet <URL: www.formfactor.com/product/probes/infinity /infinity-probe/>.
"High Performance Microwave Probes", Model 40M Low Loss Pico-probe [online], GGB Industries Inc.[retrieved on Sep. 25, 2019], Retrieved from Internet <URL: www.ggb.com/40m.html>.
"Computer Controlled Microwave Tuner—CCMT," Product Note 41, Focus Microwaves Inc., Jan. 1998.
"On Wafer Load Pull Tuner Setups", Application Note 48, FIG. 6 to 8 and 18, Focus Microwaves, Dec. 2001.
"Conductive Epdm Foam" [online], Jinan EMI Shielding Technology Co. Ltd.[retrieved on Feb. 19, 2016], Retrieved from Internet <URL: www.emishielding.com.cn/product/Conductive-EPDM-FOAM.html>.
"EMI/RFI-shielded glass 9600 series" [online], Holland Shielding Systems BV [retrieved on Feb. 19, 2016], Retrieved from Internet URL: hollandshielding.com/231-EMI%20shielded%20glass >.

* cited by examiner

*Primary Examiner* — Melissa J Koval
*Assistant Examiner* — Trung Q Nguyen

(57) ABSTRACT

A hermetically RF-EMI shielded 3-axis and planarity adjustable combo link assembly for low loss connection between the coaxial RF connector of external instruments (impedance tuners) with 30- or 45-degrees wafer probes allows continuous, micro-positioner controlled independent horizontal and vertical probe movement. Flexible sealing O-rings and RF absorbing sheets and gaskets ensure airtight and RF-EMI shielded operation.

6 Claims, 8 Drawing Sheets

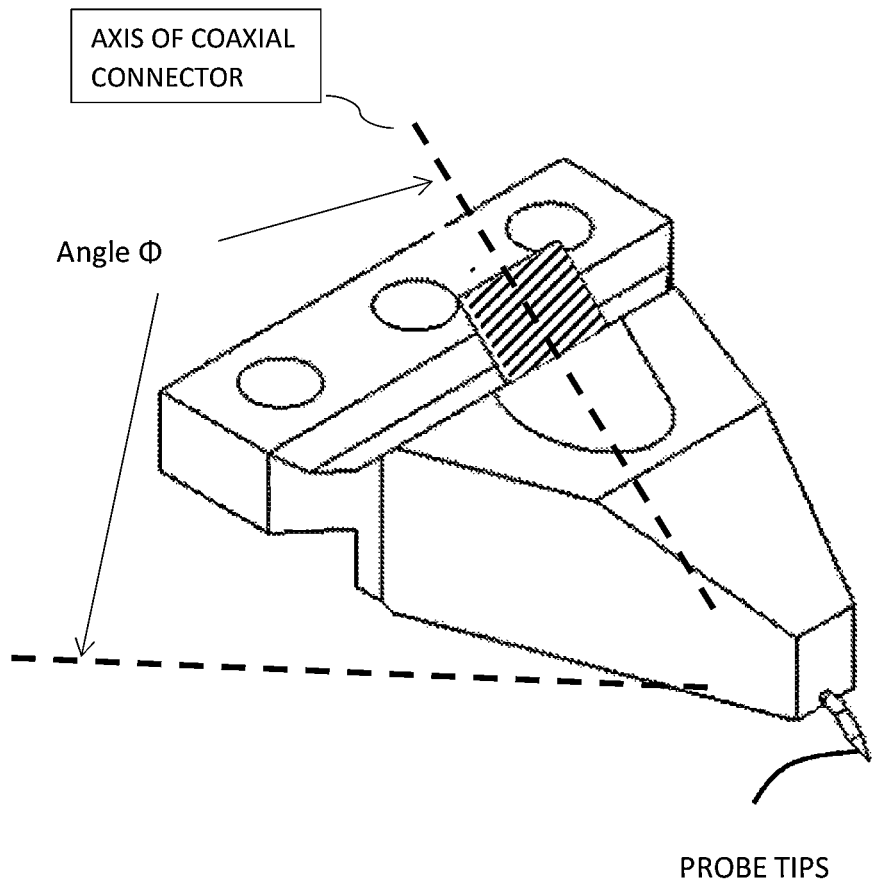
FIG. 1: Prior art

FIG. 2A: Prior art
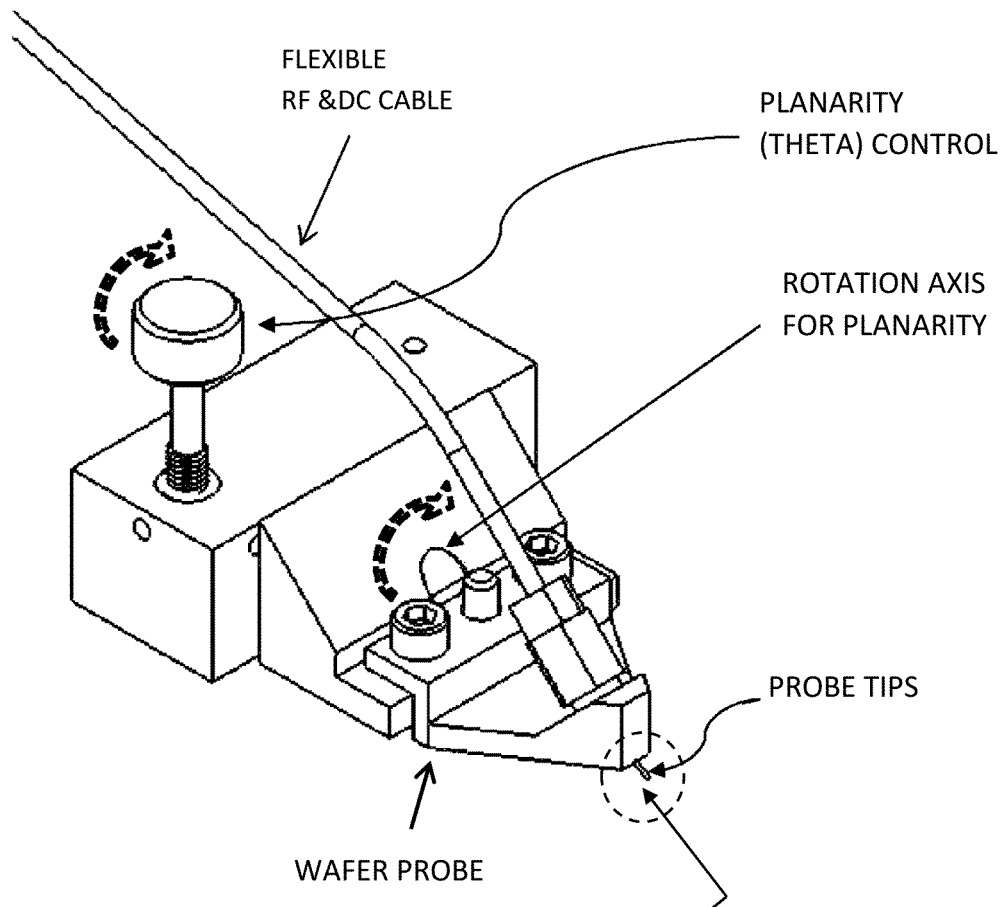
FIG. 2B: Prior art
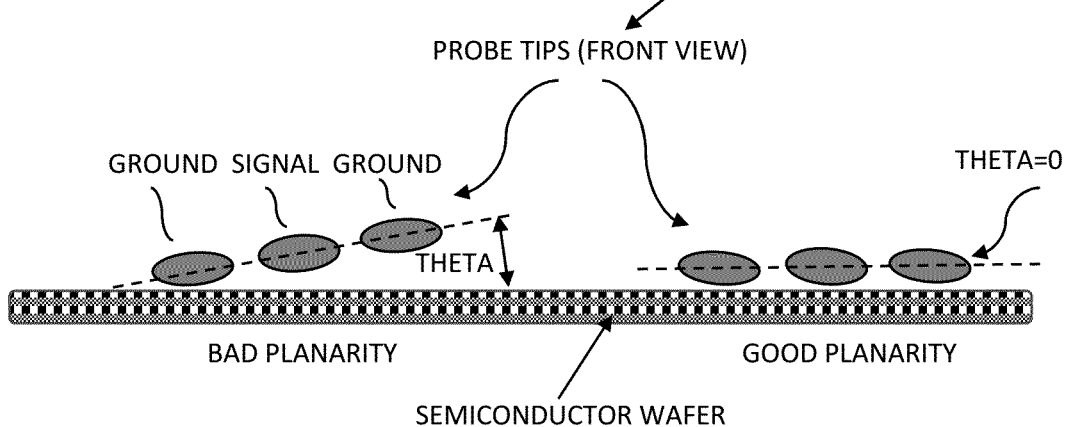

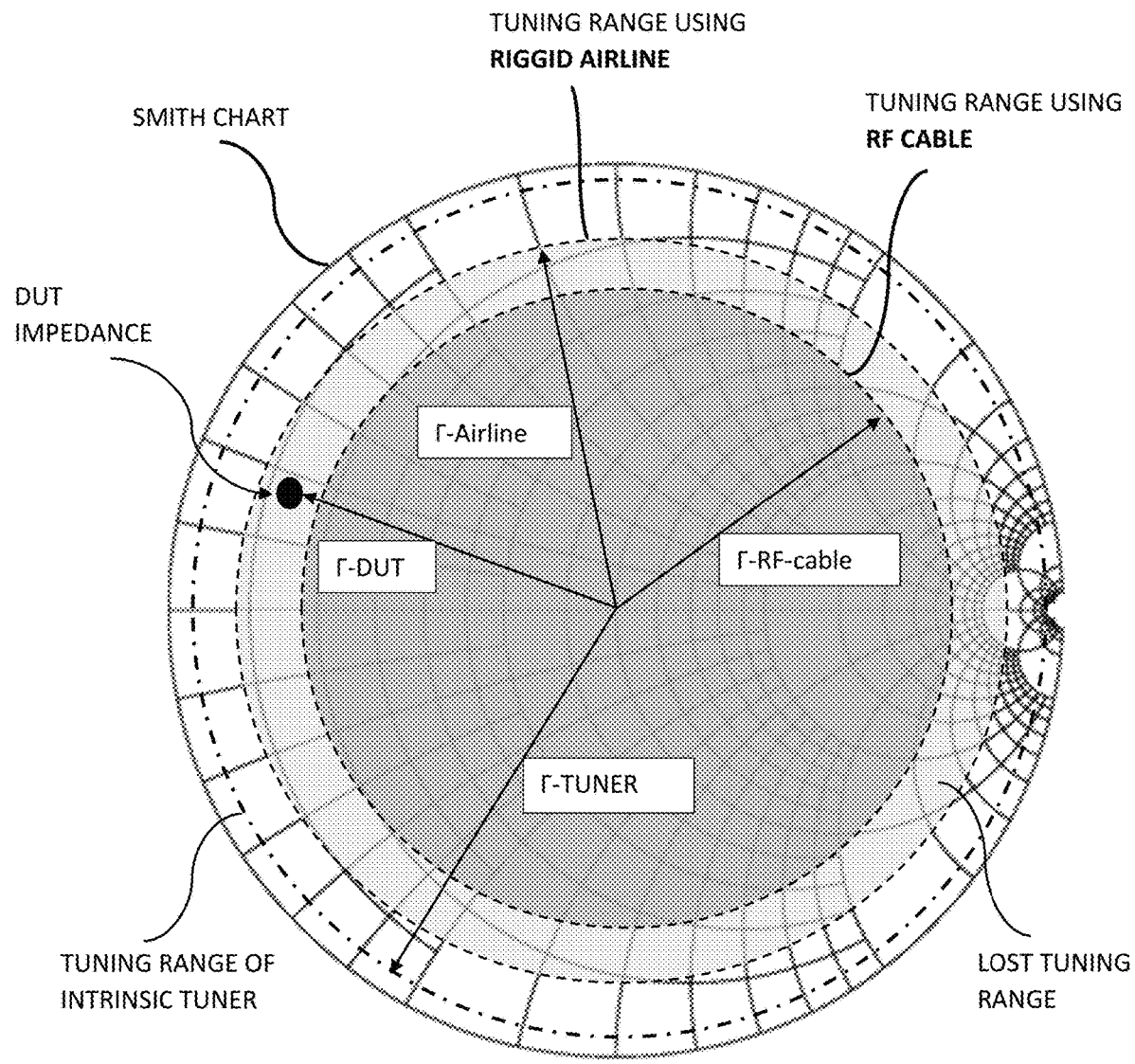
FIG. 3: Prior art

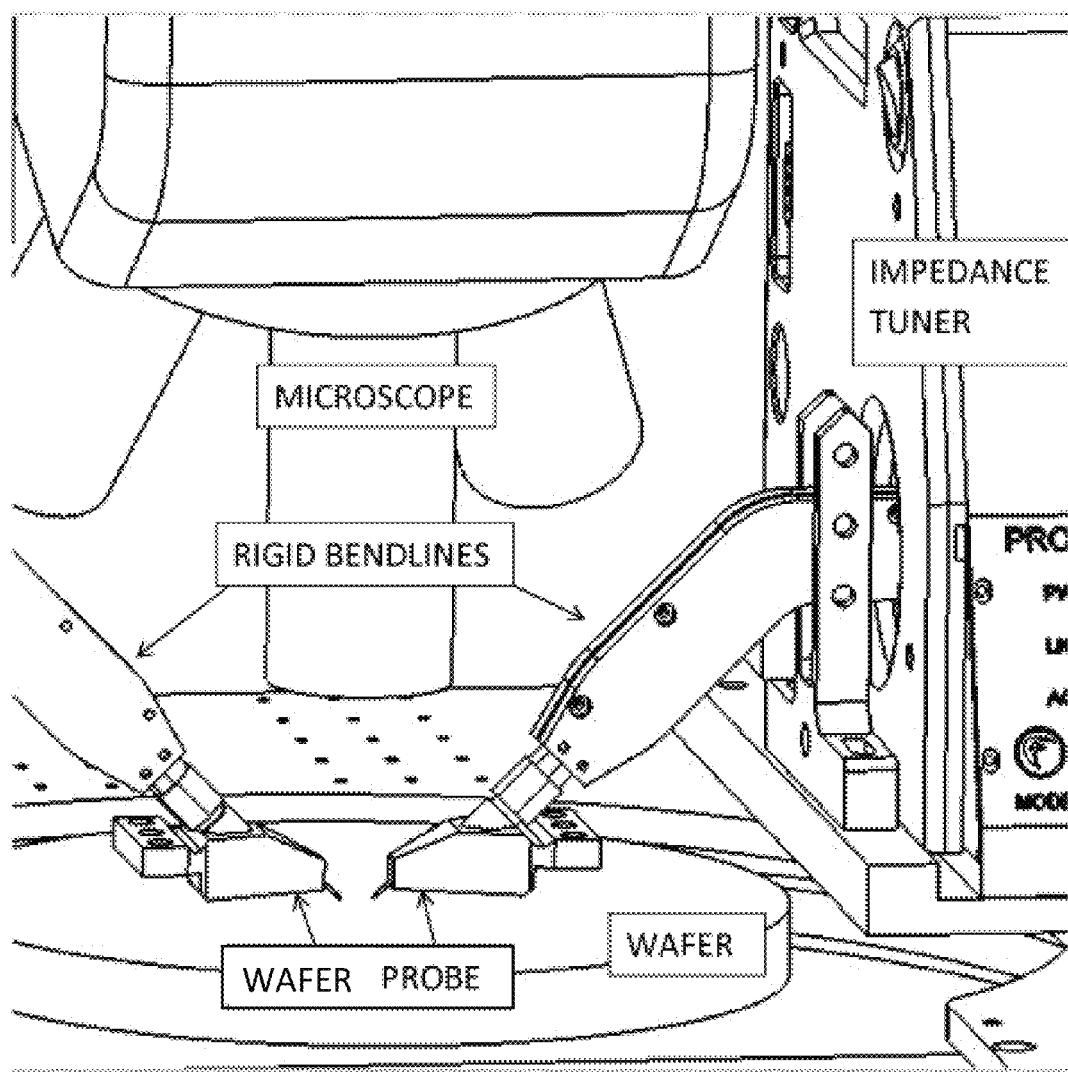
FIG. 4: Prior art

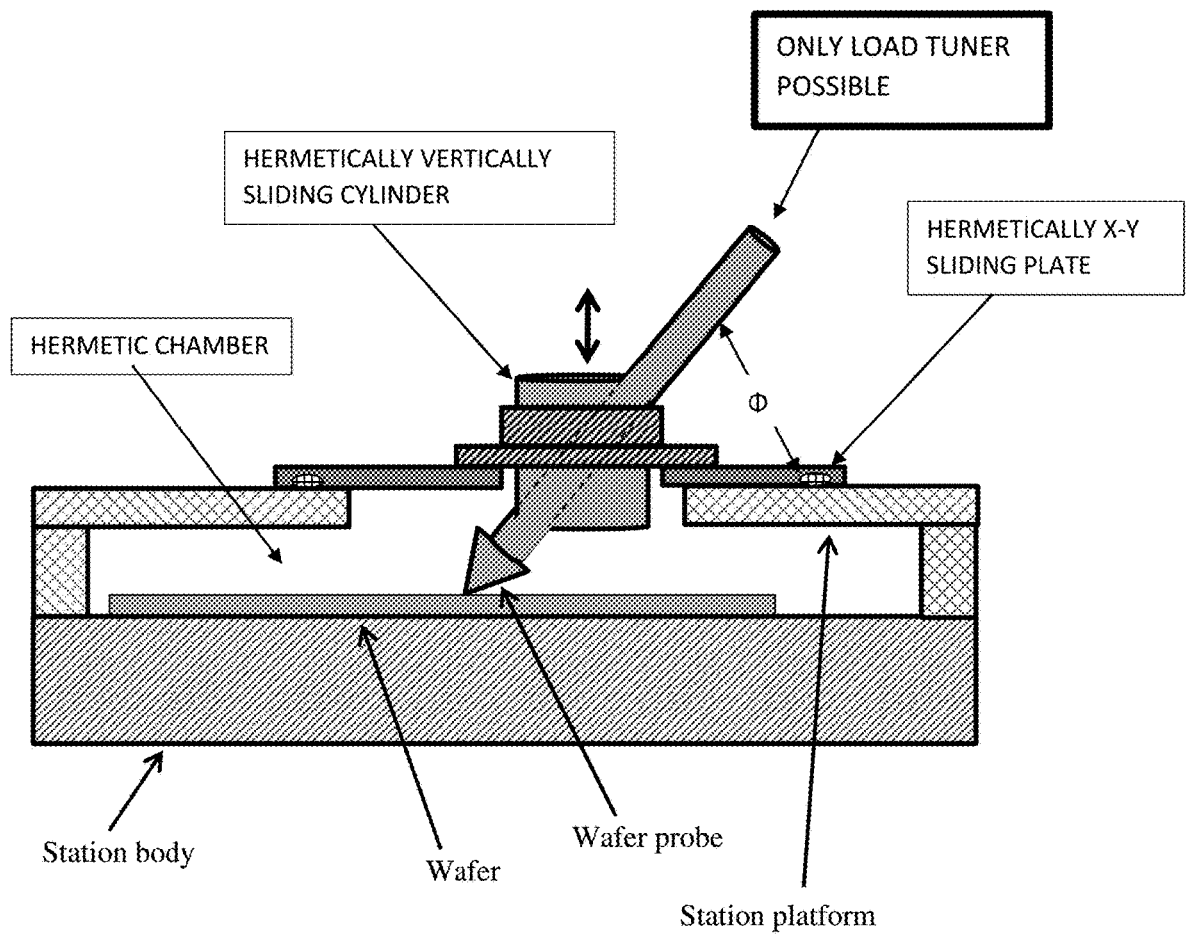
FIG. 5: Prior art

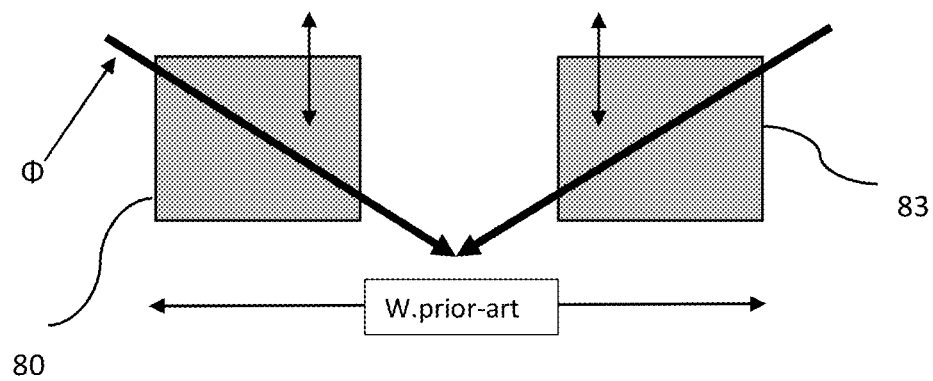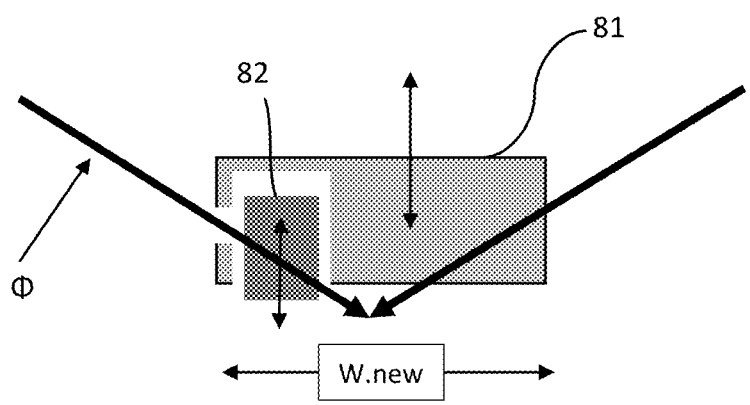
FIG. 8

HERMETIC LOAD AND SOURCE PULL WAFER PROBE STATION

PRIORITY CLAIM

Not Applicable

CROSS-REFERENCE TO RELATED ARTICLES

1. "High-frequency Performance with Low, Stable Contact Resistance on Aluminum Pads", Infinity probe [online], FormFactor [retrieved on 2019 Sep. 25], Retrieved from Internet<URL: www.formfactor.com/product/probes/infinity/infinity-probe/>.
2. "High Performance Microwave Probes", Model 40M Low Loss Pico-probe [online], GGB Industries Inc.[retrieved on 2019 Sep. 25], Retrieved from Internet <URL: www.ggb.com/40m.html>.
3. "Computer controlled microwave tuner, CCMT", product note 41, May 1997, Focus Microwaves.
4. "On Wafer Load Pull Tuner Setups", Application Note 48, FIGS. 6 to 8 and 18, Focus Microwaves, December 2001.
5. Tsironis, U.S. Pat No. 9,335,345, "A Method for Planarity Alignment of Waveguide Wafer Probes"
6. "Conductive EPDM FOAM" [online], Jinan EMI Shielding Technology Co. Ltd.[retrieved on 2016 Feb. 19], Retrieved from Internet <URL: www.emishielding.com.cn/product/Conductive-EPDM- FOAM.html>.
7. "EMI/RFI-shielded glass 9600 series" [online], Holland Shielding Systems BV [retrieved on 2016 Feb. 19], Retrieved from Internet URL: hollandshielding.com/231-EMI%20shielded%20glass>.
8. Tsironis, C. U.S. Pat No. 10,637,179, "Hermetic RF connection for on-wafer operation".

BACKGROUND OF THE INVENTION

RF and microwave devices and circuits (DUT) are best characterized in chip form "on wafer". This allows eliminating parasitic connection elements, which falsify the test results and must be corrected for by additional elaborate testing. It also allows a much larger number of devices to be tested "in situ" without having to laboriously slice the wafer, mount and wire-bond each individual chip. The "on wafer" testing is currently the preferred testing method, except for very high-power devices, (typically) beyond 20 Watt RF power, because of the limitations of the connecting microscopic contacts (wafer probe tips, FIG. 1). On-wafer testing is also the exclusive testing method in millimeter-wave frequencies above 30 GHz, since, at these frequencies, device packaging is extremely difficult to the point of uselessness.

Several manufacturers (see ref. 1, 2) make wafer probes (FIG. 1, 2A) capable of reliably testing microwave chips. The microwave probes are made, usually, using small coaxial cables with diameters of the order of 1 mm (0.04"), embedded in a solid body; because of the planar structure of the chips to be tested, the coaxial cables of the wafer probes end into a "coplanar" (GROUND-SIGNAL-GROUND) probe tip structure (FIG. 2B), whereby the center conductor of the coaxial cable becomes the signal carrying center conductor of the coplanar transmission line and the ground mantle of the coaxial cable ends up as the ground plane of the coplanar line (FIG. 2B).

Whereas the use of flexible RF (radio frequency) and DC (direct current) cables between the test equipment (impedance tuners) and the device under test (DUT), would allow position control of the wafer probes locally (see ref. 2) and (FIG. 2A), in the case of load pull the use of such cables creates prohibitively high insertion loss between the impedance tuner and the DUT and associated additional reduction of the tuning range or maximum reflection factor amplitude Γ-TUNER (FIG. 3) that the tuner can generate, rendering the DUT impedance un-reachable; Γ-RF-cable<Γ-DUT<Γ-Airline<Γ-TUNER; therefore, ultra-low loss rigid straight or bent airline inter-connections (FIG. 4) from the DUT to the load pull tuners are necessary (see ref. 4). The environmental test conditions for the wafer chips are, typically: controlled temperature, normal (near dust-free) laboratory environment and special RF-EMI (radio frequency, electro-magnetic interference) radiation-free conditions. To create those test conditions a shielded, hermetic enclosure (chamber 605, 74) is needed to protect the wafer 68, 75 on the probe station from the RF-EMI and airborne particle (dust) polluted environment (FIG. 5, 6, 7). Typical commercially available solutions to the encapsulation requirement allowing test cable access are shown conceptually in FIGS. 5 and 6 of ref. 8. In all those commercially available solutions lies some handicap either because the shielding is not leak-free (FIG. 6A, 6B in ref. 8), or because of the back and forth movement procedure of the probe, required to make or break the contact with the wafer (FIG. 5A, 5B in ref. 8) and the resulting scrapping of the probe tips on the fragile microscopic chip connection pads.

The configuration of FIG. 7, 8, 9 in ref. 8, on the other hand, while ensuring hermeticity and simple probe control, it does not include provision for full operation of a load and source pull wafer probe station by allowing controlling a source and load tuner simultaneously, except in a, not further elaborated, simplistic and cumbersome (FIG. 8) embodiment, shown in FIG. 10 of ref. 8, using a simple duplication of the device of FIG. 8 of ref. 8.

BRIEF SUMMARY OF THE INVENTION

This invention introduces a compact integrated solution, employing the basic idea of sliding cylinders, shown in FIG. 7 of ref. 8, but allowing efficient support of a source and a load impedance tuner simultaneously (FIG. 6A); this simultaneous operation also includes direct vertical, horizontal and planarity (THETA) movement control of the source and load wafer probes attached to straight rigid ultra-low loss cylindrical coaxial RF airlines; all this is combined with perfect RF-EMI and thermal shielding of the wafer area from the environment. The new apparatus is a combo configuration using two types of vertically sliding insulated cylinder: a single-hole slave cylinder (item 60 in FIG. 6A) embedded inside a dual-hole master cylinder (62 in FIG. 6A). The apparatus also includes a cover plate 602 and is shown schematically in front view and cross-section in FIG. 6A and 6B. Sealing is obtained using rubber, RF energy absorbing pieces in form of O-rings 66, tubes 65 and gaskets (see ref. 6). The overall source-load pull station (FIG. 7) shows dynamic 3-axis and static pivot (Φ) tuner control as well as provision for continuous fine THETA angle planarity alignment (FIG. 2B, 8).

DESCRIPTION OF THE VARIOUS VIEWS OF THE DRAWINGS

The invention and its mode of operation will be more clearly understood from the following detailed description when read with the appended drawings in which:

FIG. 1 depicts prior art: a microwave wafer probe and wafer probe tip.

FIG. 2A through 2B depict prior art: a wafer probe with micrometric THETA (planarity) alignment mechanism and the probe tip. FIG. 2A depicts the mechanism; FIG. 2B depicts the definition of planarity angle THETA (see ref. 1).

FIG. 3 depicts prior art: the effect of the insertion loss of the link between impedance load/source pull tuner and DUT on available tuning range at DUT reference plane., showing the limitations introduced by using flexible or semi-rigid RF cable versus low loss airline.

FIG. 4 depicts prior art: a load/source pull on-wafer setup whereby the tuners include low loss bendlines. This configuration is incompatible with hermetic chamber.

FIG. 5 depict prior art: adjustable hermetic link between a load pull tuner and wafer probe. This configuration supports only load pull or source pull, but not simultaneous load and source pull.

FIG. 6A depicts a side view; FIG. 6B depicts a cross section along the plan AB.

FIG. 8 depicts a comparison of footprint of prior art load and source configuration versus the new apparatus.

DETAILED DESCRIPTION OF THE INVENTION

Figure 6A:
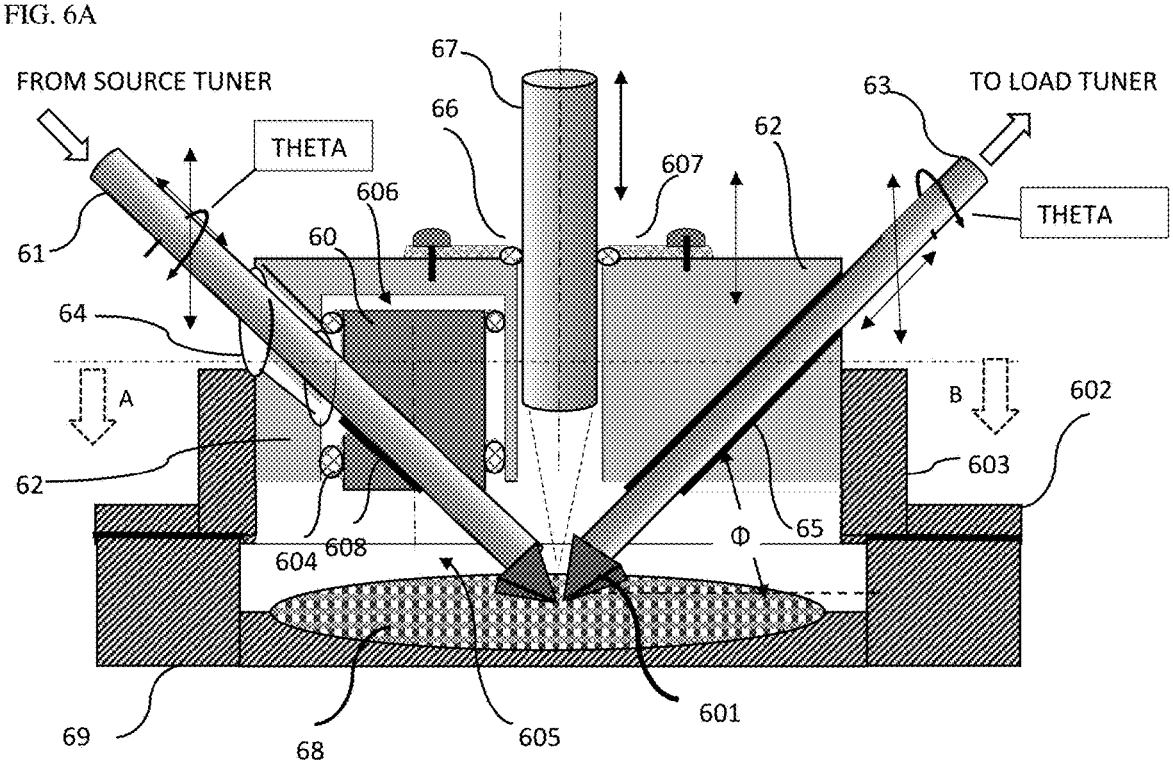
FIG. 6A through 6B depict the load and source pull test configuration.

As explained before, existing solutions for hermetically shielding the cavity surrounding the semiconductor wafer in a wafer probe station are either impractical to use or imperfect (see, FIGS. 5 and 6 in ref. 8). The solution proposed in ref. 8 cures both those basic problems but does not permit simultaneous load and source pull operation. As shown in FIG. 8 the prior art solution of FIG. 11 in ref. 8 allows load and source pull operation, but is cumbersome because the cylinders 80 and 83 occupy a larger footprint than the combo cylinder 81-82 and requires more probe station space: W.prior-art>>W.new. It also requires complete disassembly and a new cover plate 111 in ref. 8 to accommodate for the different distance between cylinders, when using wafer probes of different angle Φ. Instead, in the present apparatus a change in Φ is accommodated by inserting or withdrawing the airlines 63 and lifting or lowering the wafer 68, 75.

The herein proposed solution cures these shortcomings by using a RF-EMI shielded link, as part of an assembly, which ensures (i) hermetical operation, (ii) normal handling and integration of two tuners and (iii) compatibility with existing wafer probes and probe stations. The RF-EMI shielded link includes a master cylinder 62 hermetically sliding into a vertical collar 603 which is mounted on an opening 605 of the cover plate 602 of the platform 69, 76 of the probe station. The master cylinder 62 houses a slave cylinder 60 which slides vertically shielded inside the cavity 606 of the master cylinder. Both the slave 60 and the master 62 cylinders have slanted holes 64 and 65 the master and 608 the slave cylinder, traversing diametrically the cylinders under a nominal angle Φ of 30 or 45 degrees, depending on the wafer probe type to be used.

The master cylinder 62 has a vertical cylindrical cavity 606 in which the slave cylinder 60 can move vertically, RF-EMI shielded using appropriate O-rings 604 inserted between the two cylinders. The cylindrical airlines 63 and 61 are inserted under the specific angle Φ of 30 or 45 degrees into the holes of the cylinders. Airline 63 slide-fits into the hole of cylinder 62 and appropriate the RF-EMI shielding RF absorbing tubular gasket 65. Airline 61 traverses loosely the hole 64 into master cylinder 62 and slide-fits into the hole 608 of slave cylinder 60. This configuration allows airline 61 and the attached wafer-probe to move inside the large hole 64 controlling the independent movement of the slave cylinder 60 and is able to create proper chip contact jointly with the wafer probe 601 of airline 63.

In order to operate the probe station requires a microscope 67. This is inserted and height-adjusted vertically into a hole of the master cylinder 62 and is RF-EMI shielded using a cover plate 607 (see ref. 7) and a RF absorbing set of O-rings 66 (see ref. 6). The cylinders 60 and 62 are controlled vertically by the airlines 63 and 61, wherein airline 63 controls the master cylinder 62 and airline 61 controls the slave cylinder 60. At the same time the airlines can be rotated (angle THETA) using appropriate mechanism in the 3-axis tuner positioners 71 and 77.

Figure 6B:
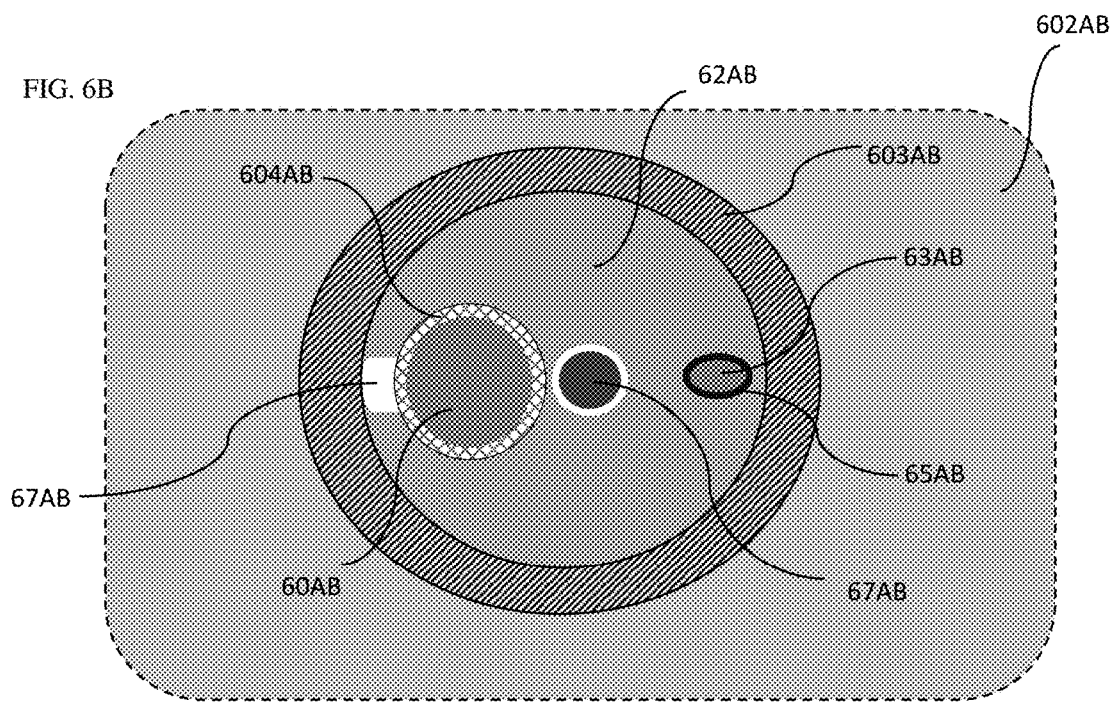

A cross-section of the apparatus without airlines along plan A-B is shown in FIG. 6B. the microscope cross section is shown as item 67AB; the cover plate is shown as item 602AB, the master cylinder as 62AB, the slave cylinder as 60AB, the O-ring between the two cylinders as 604AB, the narrow opening for airline 63 as item 63AB, the RF absorbing tube 65AB and the large opening for airline 61 as item 67AB. The narrow hole 608 inside the slave cylinder is not visible because the cross-section plan AB traverses above it. Also visible is the vertical 60 ring 603AB inside which slide-fits the master cylinder 62AB.

Figure 7:
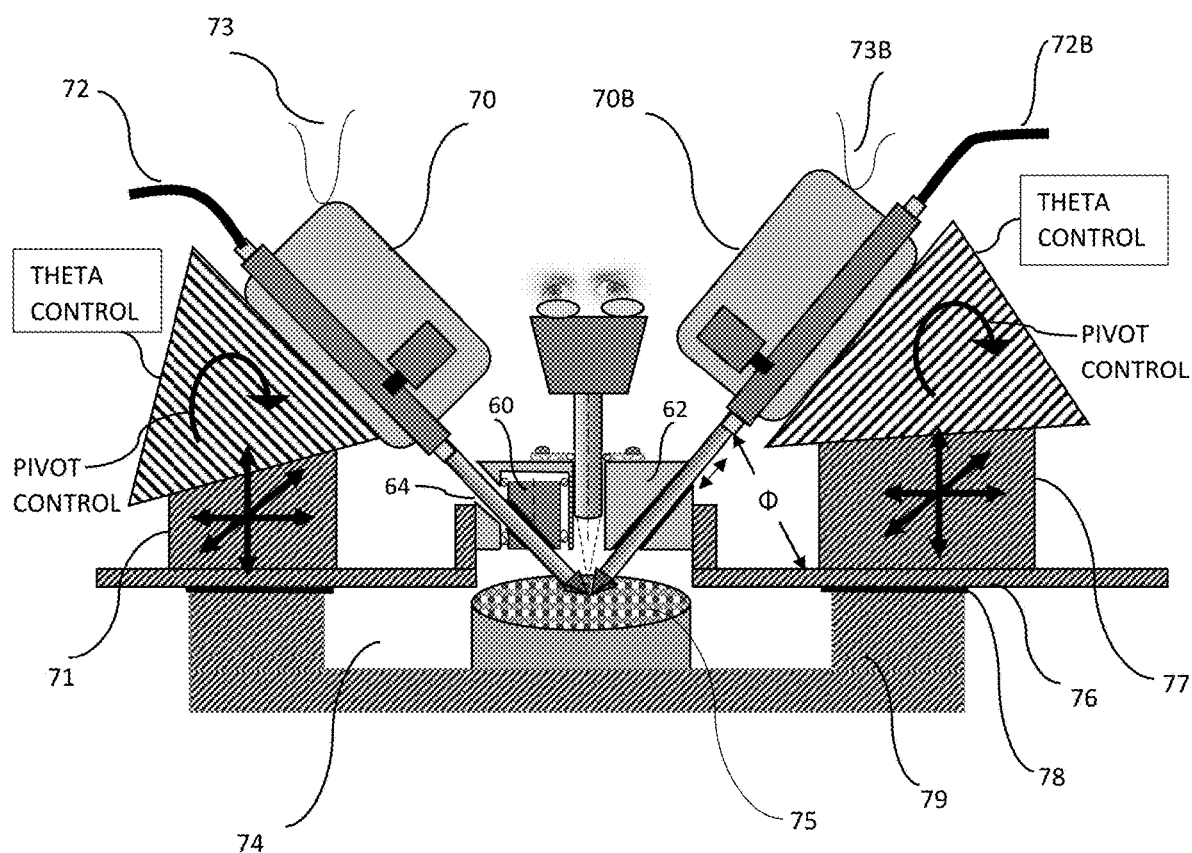
FIG. 7 depicts the load and source pull test setup including the impedance tuners, the tuner positioners on the probe station, the pivot and the planarity (THETA) adjustment mechanism.

The entire load and source pull station is shown in FIG. 7. The slide screw impedance tuners 70 and 70B (see ref. 3) are remotely controlled 73, 73B and mounted on 3-axis positioners 71, 77, which are mounted on the covering plate 76, which slides on the station body 69, 79 RF-EMI shielded using RF energy absorbing gasket 78. of the station, pivoted under an angle Φ for matching the angle of the wafer probe 601 (FIG. 1) in order to allow in-line, straight, direct and minimum insertion loss connection with the tuner airline in order to maximize the tuning range (FIG. 3). The 3-axis positioners 71, 77 have a pivoting head that can be adapted to the probe angle Φ and also allows rotating the tuners 70, 70B independently, in order to correct for non-planarity THETA misalignment of the probes (FIG. 2B and ref. 5). Contact with the semiconductor wafer 75 inside the RF-EMI shielded chamber 74 is made and broken by lowering and lifting independently the tuners 70 and 70B and the attached airlines using the 3-axis positioners 71, 77; hereby positioner 77 controls the master cylinder 62 and positioner 71 controls, independently, the slave cylinder 60. The larger hole 64 allows for a relatively small independent adjustment. The impedance tuners are connected with auxiliary test equipment using RF cables 72, 72B.

The present invention has been hereby disclosed in the form of a preferred embodiment. Obvious alternatives are imaginable but shall not be construed to trespass on the basic idea of using a dedicated hermetically sliding cylindrical combo device holding the two coaxial airlines allowing easy 3-axial manhandling and micro-positioning wafer probes in a shielded wafer probe load and source pull station environment.

What is claimed is:

1. An RF-EMI hermetically shielded, load and source pull wafer probe test station comprising:
    an RF-EMI shielded chamber having a top cover, a bottom plate and sidewalls, and capability for carrying a semiconductor wafer on the bottom plate, and a combo, 3-axis (X-Y-Z) and planarity (THETA) adjustable, RF and DC connection assembly allowing double, direct, low-loss and shielded connection of a load and a source impedance tuner with wafer probes, wherein the combo adjustable RF and DC connection assembly comprises: a first section and a second section of straight low-loss coaxial cylindrical airline, a master vertically sliding cylinder and a slave vertically sliding cylinder, and a plate covering an opening in the top cover of the RF-EMI shielded chamber;

wherein the vertically sliding cylinders have holes traversing diametrically under an angle ($\Phi$) from near the top to near the bottom of the cylinders; the master cylinder has a first hole allowing the first section of coaxial airline to slide-fit inside it and a diametric secondary hole with a diameter large enough to allow to the traversing second section of coaxial airline free movement; the slave cylinder has a single hole allowing the second section of coaxial cylindrical airline to slide-fit inside it; and wherein the master cylinder slide-fits inside a hole in the covering plate, and the covering plate slides on the top cover of the RF-EMI shielded chamber; and wherein the master cylinder has a vertical cylindrical cavity, in which the slave cylinder is inserted and slides independently and RF-shielded inside the master cylinder; and wherein the first section of coaxial cylindrical airline traverses the first hole of the master cylinder, and the second section of coaxial cylindrical airline traverses the secondary hole of the master cylinder and the single hole of the slave cylinder, and wherein the source and load pull impedance tuners are directly attached in-line to the coaxial cylindrical airlines and are controlled by external 3-axis positioners with planarity (THETA) adjustment and pivoting ($\Phi$) capability, wherein pivoting ($\Phi$) capability is the 3-axis position mechanism having a pivoting head that can be adapted to the probe angle ($\Phi$); and wherein all sliding contacts between surfaces are hermetically RF-EMI shielded.

2. The RF-EMI hermetically shielded, load and source pull wafer probe test station of claim 1, wherein the angle $\Phi$ of the holes traversing the cylinders is 30 degrees.

3. The RF-EMI hermetically shielded, load and source pull wafer probe test station of claim 1, wherein the angle $\Phi$ of the holes traversing the cylinders is 45 degrees.

4. The RF-EMI hermetically shielded, load and source pull wafer probe test station of claim 1, wherein movement of the vertical cylinders is RF-EMI shielded using appropriate RF absorbing rubber O-rings.

5. The RF-EMI hermetically shielded, load and source pull wafer probe test station of claim 1, wherein the external 3-axis positioners with planarity (THETA) and pivot ($\Phi$) capability are attached to a platform of the wafer probe test station.

6. The RF-EMI hermetically shielded, load and source pull wafer probe test station of claim 1, wherein the sliding surfaces between the coaxial airlines and the cylinders are hermetically RF-EMI shielded using tubular RF energy absorbing gaskets, and wherein the sliding surface between the covering plate and the top cover is hermetically RF-EMI shielded using sheets of RF energy absorbing gaskets.

* * * * *